United States Patent
Schmidt et al.

(10) Patent No.: US 7,567,206 B1
(45) Date of Patent: Jul. 28, 2009

(54) INTEGRATED CIRCUIT FOR MEASURING THE DISTANCE AND/OR VELOCITY OF OBJECTS

(75) Inventors: Ewald Schmidt, Ludwigsburg (DE); Klaus Voigtlaender, Wangen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/999,765

(22) Filed: Nov. 29, 2004

(30) Foreign Application Priority Data

Nov. 28, 2003 (DE) ................................ 103 55 796

(51) Int. Cl.
 *G01S 7/02* (2006.01)
 *G01S 7/35* (2006.01)
 *G01S 13/00* (2006.01)
 *G01S 13/93* (2006.01)

(52) U.S. Cl. ............................ 342/175; 342/27; 342/28; 342/70; 342/104; 342/105; 342/107; 342/109; 342/115; 342/118; 342/128; 342/192; 342/195; 342/196; 701/300; 701/301

(58) Field of Classification Search .................. 701/300, 701/301; 180/167–169; 342/27, 28, 70–72, 342/104–115, 118, 127–133, 159–162, 175, 342/192–197
See application file for complete search history.

(56) References Cited

U.S. PATENT DOCUMENTS

| | | | |
|---|---|---|---|
| 4,492,960 A | | 1/1985 | Hislop |
| 5,115,245 A | * | 5/1992 | Wen et al. .................... 342/175 |
| 5,481,268 A | * | 1/1996 | Higgins ....................... 342/70 |
| 5,724,042 A | * | 3/1998 | Komatsu et al. ............. 342/175 |
| 5,767,793 A | * | 6/1998 | Agravante et al. .......... 180/167 |
| 5,940,011 A | * | 8/1999 | Agravante et al. .......... 180/167 |
| 6,037,894 A | | 3/2000 | Pfizenmaier et al. |

(Continued)

FOREIGN PATENT DOCUMENTS

DE 196 10 850 4/1997

(Continued)

OTHER PUBLICATIONS

"Duplexer or Diplexer, that is the Question"; no author listed; no date listed; copyright in the year 2006; Coastal Plains Amateur Radio Club; posted on the Internet at www.w4pvw.us.*

(Continued)

*Primary Examiner*—Bernarr E Gregory
(74) *Attorney, Agent, or Firm*—Kenyon & Kenyon LLP (57) ABSTRACT

An integrated circuit for measuring the distance and/or velocity of objects, having: a high-frequency signal generating device for generating a first HF signal having a predefined frequency and a predefined modulation curve from at least one LF signal; a diplex/mixing device, which is coupled to the high-frequency signal generating device for determining a frequency offset between the first HF signal and a reflected second HF signal; a transceiver device, which is coupled to the diplex/mixing device, for sending the first HF signal and simultaneously receiving the reflected second HF signal, which is a function of a predefined modulation curve of the first HF signal and a distance to a reflecting object; and an adapter device, which is coupled between the diplex/mixing device and the transceiver device, for adapting the impedance of the transceiver device as a function of the frequency of the first HF signal.

16 Claims, 5 Drawing Sheets

U.S. PATENT DOCUMENTS 6,130,640 A * 10/2000 Uematsu et al. ............. 342/175
6,972,709 B1 * 12/2005 Deem et al. .................... 342/70

FOREIGN PATENT DOCUMENTS

| | | |
|---|---|---|
| DE | 196 48 203 | 6/1998 |
| DE | 199 63 005 | 6/2001 |
| WO | WO 99/10756 | 3/1999 |

OTHER PUBLICATIONS

Definition of the term "Diplexer" from the Federal Standard 1037C: Glossary of Telecommunications Terms; no author given; no date given; webpage last generated Aug. 23, 1996; posted on the Internet at www.its.bldrdoc.gov.*

Definition of the term "Duplexer" from the Federal Standard 1037C: Glossary of Telecommunications Terms; no author given; no date given; webpage last generated Aug. 23, 1996; posted on the Internet at www.its.bldrdoc.gov.*

Yamano, Shinichi et al., "76GHz Millimeter Wave Automobile Radar Using Single Chip MMIC," Fujitsu Ten Tech. J. No. 23, 2004, retrieved from internet at http://www.fujitsu-ten.co.jp/english/outline/en_pdf/23/23-2.pdf.

Chang et al., "Forward-Looking Automotive Radar Using a W-band Single-Chip Transceiver" IEEE Transactions on Microwave Theory and Techniques, vol. 43, No. 7, pp. 1659-1668, Jul. 1995.

Reynolds et al., "Single Chip FMCW Radar for Target Velocity and Range Sensing Applications" 11$^{th}$ Annual GaAs IC Symposium, Technical Digest, pp. 243-246, 1989.

Olbrich, M. O. et al.: "A planar hybrid transceiving mixer at 76.5 GHz for automotive radar applications" Advances in Radio Science (2003), vol. 1, pp. 207-210.

Mondal, J. et al.: "77 GHz MMIC T/R Module for Diplex Radar Application in Collision Avoidance Radar (CAR)" Gallium Arsenide Integrated Circuit (GAAS IC) Symposium, 1998, 20th Annual Atlanta, GA, USA, Nov. 1-4, 1998, New York, NY, USA, IEEE, US, Nov. 1, 1998, pp. 181-184.

* cited by examiner

INTEGRATED CIRCUIT FOR MEASURING THE DISTANCE AND/OR VELOCITY OF OBJECTS

FIELD OF THE INVENTION

The present invention relates to an integrated circuit for measuring the distance and/or velocity of objects, in particular an integrated circuit for detecting the surroundings of a vehicle via radar.

BACKGROUND INFORMATION

The use of a multibeam motor vehicle radar system for detecting the distance and/or velocity of an object is discussed, for example, in German Published Patent Application No. 196 48 203. In the case of at least one antenna, which forms a total of at least two antenna lobes, at least one of these antenna lobes is used for transmitting and receiving radar signals, an additional antenna lobe being exclusively used for receiving radar signals.

German Published Patent Application No. 199 63 005 describes a method and a device for detecting and analyzing objects in the surroundings of a vehicle in which the objects are detected using at least one radar sensor and distance data and/or velocity data of the objects is analyzed in at least one analyzer unit. The surroundings of the vehicle are detected using a transmitted signal of a pulse radar sensor in one or more receiving branches in such a way that different distance ranges are analyzed sequentially and/or simultaneously.

The disadvantage of the known systems is in particular that a complex and bulky, and therefore cost-intensive radar system is provided, which has different individual components which must be connected in a high-frequency compatible manner. Because the operating frequencies of such radar systems will assume higher values in the future, the parasitic effects also increase due to the parasitic inductances and capacitances of the connections between the individual components according to the related art. If the discrete components such as a chip for producing an HF signal, distributing network and, mainly, antennas, are mounted onto a substrate device made of ceramic, LTCC, a circuit board or a soft board, strong parasitic effects are to be expected at high frequencies, particularly over 50 GHz, due to the tolerances in manufacturing and connections.

SUMMARY OF THE INVENTION

The integrated circuit according to the present invention for measuring the distance and/or velocity of objects has the advantage over the known approaches that a highly integrated system and chip technology is provided, which provides a high degree of reliability, low costs and minimum parasitic effects in a compact design despite a high operating frequency of more than 20 GHz, for example. For this purpose, the transmitting and/or receiving devices, i.e., antennas, must be integrated on one chip in addition to a high level of integration of circuit components. The chip only has interfaces which are only exposed to LF signals but not to the HF signal.

The present invention is based on the basic idea that individual, discrete components or partially integrated circuit components are combined into a single highly integrated module which also has a transceiver device, and in particular an adapter network for the antenna. In addition, digital circuit elements for signal processing and/or A/D conversion may be preferably integrated on the semiconductor chip. The system is thus partitioned into subsystems in such a way that there are only interfaces exposed to low operating frequencies. Due to the limited bandwidth of an antenna integrated on a chip, the system concept is preferably refined using an adapter network in such a way that a predefined system performance is achieved.

In other words, an integrated circuit for measuring the distance and/or velocity of objects is provided, having a high-frequency signal generating device for generating a first HF signal having a predefined frequency and a predefined modulation curve from at least one LF signal; a diplex/mixing device, which is coupled to the high-frequency signal generating device for determining a frequency offset between the first HF signal and a reflected second HF signal; a transceiver device, which is coupled to the mixing device for transmitting the first HF signal and simultaneously receiving the reflected second HF signal which is a function of a predefined modulation curve of the first HF signal and a distance to a reflecting object; and an adapter device, which is coupled between the diplex/mixing device and the transceiver device for adapting the impedance of the transceiver device as a function of the frequency of the first HF signal.

A preferred refinement provides an interface device for injecting at least one digital signal, preferably via a CAN bus, and/or a digital signal processing device, which is coupled to the high-frequency signal generating device and preferably to the interface device for processing the at least one digital signal and controlling the integrated circuit, and/or an A/D converter which is coupled to the diplex/mixing device and the signal processing device for digitizing the frequency offset. Digital function blocks, such as a digital signal processor and/or an analog/digital converter, and appropriate interfaces may thus be advantageously and cost-effectively integrated on the chip, thereby also saving space.

According to another preferred refinement, the high-frequency signal generating device has a modulation device, which is preferably directly coupled to the diplex/mixing device, and an oscillator, preferably a VCO (voltage control oscillator) connected downstream from the modulation device. A simple and cost-effective structure for generating the modulated HF transmitted signal may thus be advantageously provided.

According to another preferred refinement, the integrated circuit is implemented using BiCMOS technology and/or has SiGe or SiGeC or SiC as the semiconductor substrate. High-frequency compatible antennas are thus manufacturable in a cost-effective manner and have a precisely determinable, narrow-band emission characteristic, which is a function of the antenna dimensions.

According to another preferred refinement, the transceiver device has a patch antenna with a predefined alignment, in particular at an angle of 0° or 45° of a long side of the patch antenna to a long side of the integrated circuit, preferably for a frequency range of the first HF signal between 20 GHz and 300 GHz. This offers the advantage of a predefinable emission characteristic of radar systems having long and/or short ranges for the detection of the surroundings due to the integrated circuit according to the present invention.

According to another preferred refinement, the adapter device has a capacitor-coil-capacitor filter circuit, for example, preferably a Collins filter having adjustable impedance. It is possible to calibrate or adapt the antenna for emitting any desired frequency bandwidth using such an adapter network. The narrow-band emission characteristic of an integrated patch antenna may thus be advantageously shifted within a certain frequency band and thus increased overall.

According to another preferred refinement, a radar surroundings detection device having a plurality of integrated circuits of the type according to the present invention is provided with an emission device over each integrated circuit, which is preferably made of a truncated cone-shaped dielectric, in which preferably at least one in particular patch-shaped conductive layer, corresponding to a dielectrically shortened Yagi antenna, is provided in parallel to the transceiver device. This offers the advantage that the integrated antenna concept [is] provided by external, focusing antenna elements such as a polyrod having a plurality of additional patches in particular.

According to another preferred refinement, the emission devices are interconnected via a shared substrate, a casting compound having a predefined dielectric constant being preferably provided over the integrated circuits. Consequently, a plurality of polyrods is advantageously combined in a shared workpiece, whereby tolerances are reduced and simplified assembly is made possible, while the chips are protected.

According to another preferred refinement, four, five or six integrated circuits, for example, are provided next to one another in a row with a predefined alignment, in particular at an angle of 0° or 45° between a long side of the integrated circuit and a long side of a substrate device and/or in a double triplet arrangement in parallel or antiparallel to one another and/or in an antiparallel arrangement featuring integrated circuits offset with respect to one another. This offers the advantage that planar arrangements of a plurality of chips having a predefined emission characteristic may be achieved.

According to another preferred refinement, at least two integrated circuits having a predefined frequency spacing with respect to one another and a predefined modulation curve synchronized to one another may be operated. Synchronous operation of the individual oscillators advantageously permits additional ascertainable correlation information. In addition, it has the advantage that the system concept featuring a plurality of narrow-band, non-overlapping frequency responses ensures high mutual interference suppression in the useful band, i.e., in the range of the frequency of the first HF signal.

According to another preferred refinement, an amplifier device for amplifying the frequency offset signal is connected downstream from the diplex/mixing device, which is preferably coupled to a third HF signal of a second frequency generating device for determining a cross-correlation between the frequency offset and the third HF signal. Cross echo information may thus advantageously also be obtained for overlapping directional diagrams via predefined intermediary frequencies, such as 200 MHz, 400 MHz, or 600 MHz.

DETAILED DESCRIPTION

In the figures, identical reference symbols denote identical components or components having identical functions.

Figure 1:
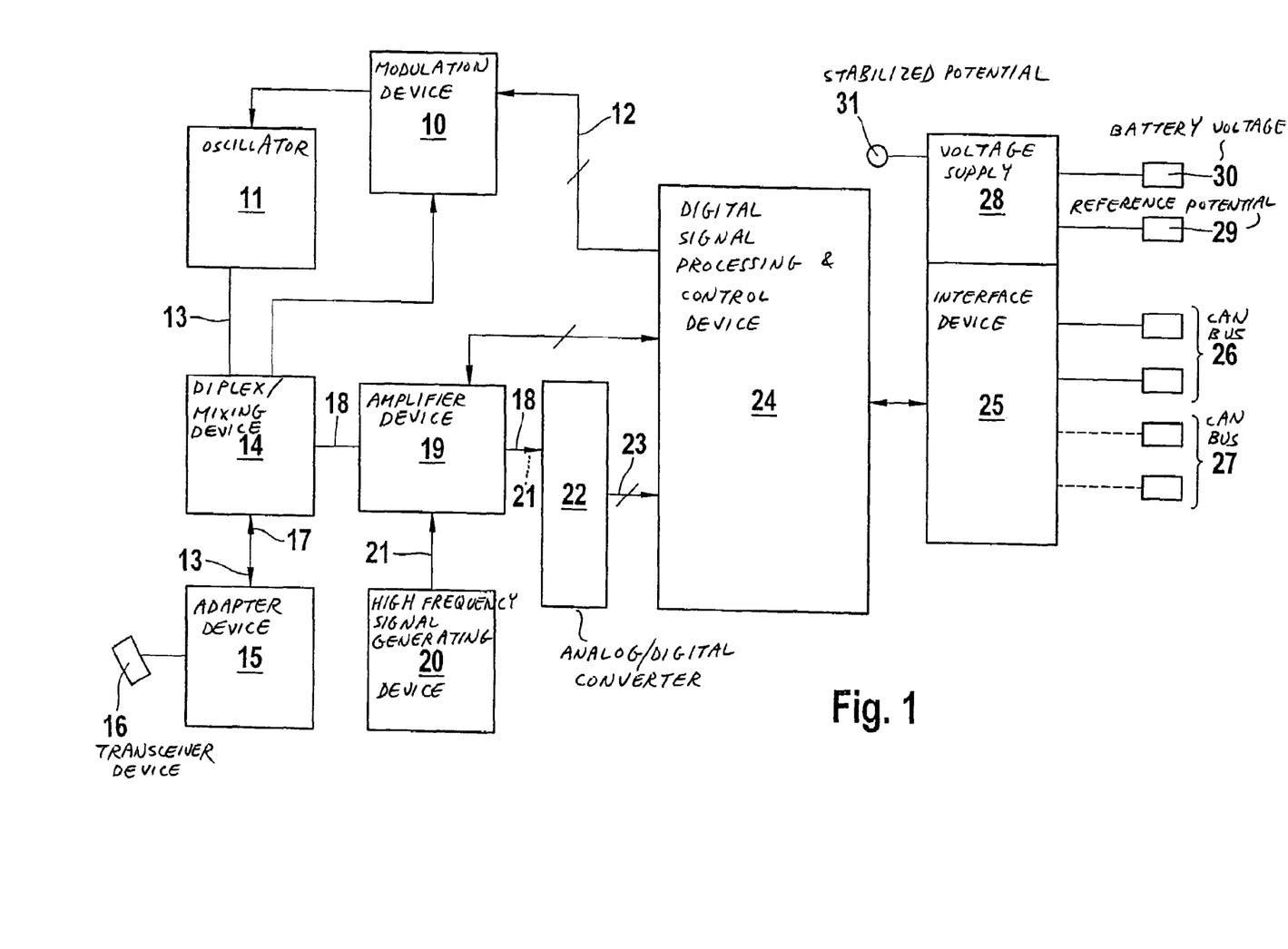
FIG. 1 shows a schematic block diagram to elucidate an embodiment of the present invention.

FIG. 1 schematically shows, as a block diagram, an integrated circuit for measuring the distance and/or velocity of objects according to a preferred embodiment of the present invention. A high-frequency signal generating device, which preferably has a modulation device 10 and a downstream oscillator 11, in particular a VCO (voltage control oscillator), is supplied with a low-frequency signal 12, preferably a digital word. LF signal 12 generates a predetermined modulation curve in modulation device 10; the modulation curve is supplied to the oscillator, which generates a first HF signal 13 according to the modulation curve. HF signal 13 has, for example, a mid-frequency between 20 GHz and 300 GHz, preferably approximately 77 GHz, this being preferably modulated in a triangular shape at a fixed modulation rate between 50 MHz and 500 MHz per ms.

HF signal 13 then passes through a diplex/mixing device 14, is supplied to an adapter device 15, i.e., an adapter network, and is emitted by a transceiver device 16. Adapter device 15 is preferably designed as a capacitor-coil-capacitor network (CLC network), and constructed in particular as a Collins filter. The impedance of transceiver device 16, a patch antenna, for example, may be adapted to the frequency of first HF signal 13 via adapter device 15. This allows broadband use of an otherwise narrow-band antenna. A second HF signal 17 reflected by an object (not illustrated) is supplied by transceiver device 16 to diplex/mixing device 14 via adapter device 15.

A frequency offset 18 between the transmitted HF signal 13 and the second received, i.e., reflected, HF signal 17, is determined and output in diplex/mixing device 14. Frequency offset 18, for example, in the range between 1 KHz and 100 KHz, results from the modulation curve, i.e., the frequency shift per time unit, of transmitted HF signal 13 and the time required by the radar wave between transceiver device 16 and a detected object (not illustrated). Diplex/mixing device 14 is also preferably connected to modulation device 10 to make mid-frequency regulation of first HF signal 13 via feedback information possible. The level of frequency offset 18 is then preferably raised in an amplifier device 19.

According to a preferred refinement, a third HF signal 21 is supplied to frequency offset 18 in amplifier device 19 by a second high-frequency signal generating device 20 to be able to perform cross-correlation. Frequency offset 18 and/or third HF signal 21 are then supplied to an analog-digital converter 22 and converted into a digital word 23 of a predefined bit length. In addition, a digital signal processing and control device 24 is preferably provided on the integrated circuit, which forwards digital LF signal 12 to modulation device 10 and receives digital word 23 converted by A/D converter unit 22. In addition, a direct connection is preferably provided between digital signal processing and control device 24 and amplifier device 19, for example, for level adaptation of frequency offset 18 by signal processing and control device 24.

Data is preferably exchanged between digital signal processing and control device 24 and components or electric devices outside the chip via an interface device 25, which is connected, for example, to a first CAN bus 26 and preferably to a second CAN bus 27. In addition, a voltage supply 28 is coupled to a reference potential 29, a battery voltage 30, and a stabilized potential 31 and provided on the integrated chip.

Figure 2:
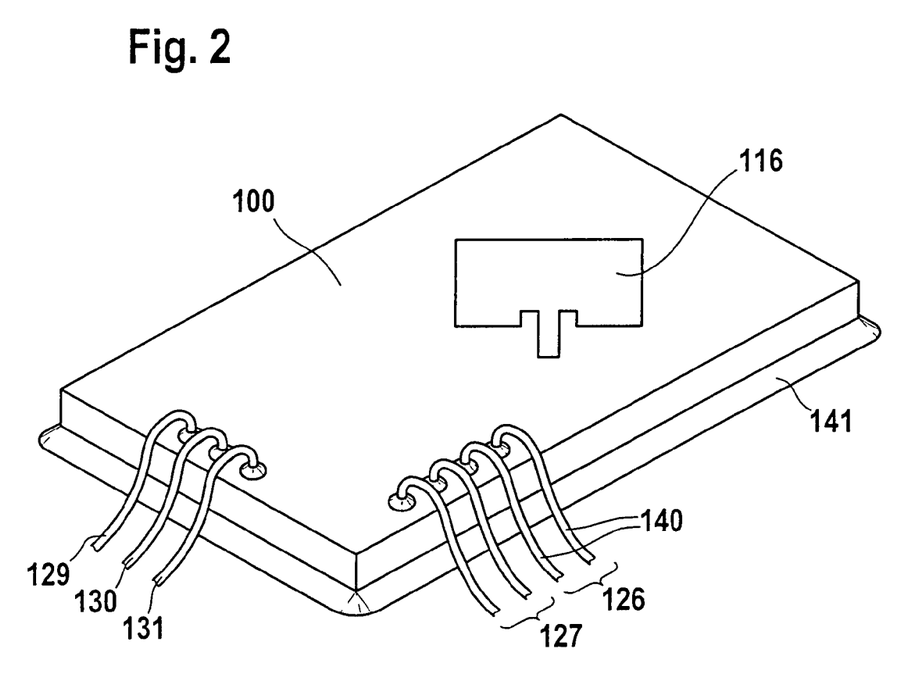
FIG. 2 shows a schematic oblique top view of an integrated circuit to elucidate an embodiment of the present invention.

FIG. 2 shows an integrated circuit 100, which has an internal structure according to FIG. 1. A transceiver device 116, preferably a patch antenna, provided at a 45° angle between a long side of integrated circuit 100 and a broad side of patch antenna 116, is provided on the surface of integrated circuit 100. Patch antenna 116 may assume any other desired angle values between its broad side and the long side of integrated circuit 100. Integrated circuit 100 is connected to the outside via bond wires 140 to first and second CAN bus 126, 127. Voltage is supplied according to FIG. 1 via a voltage source 130, a stabilized voltage source 131, and a reference potential 129. Integrated circuit 100 is attached to the substrate device (not shown), for example, via an attachment device 141, for example, a molding compound or an adhesive. A direct voltage is applied to integrated circuit 100 via voltage supply connections 129, 130, 131, and a low-frequency signal (LF signal) having a frequency <3 GHz in particular is applied to bond wires 140 used for connecting CAN buses 126, 127.

Patch antenna 116 is preferably applied to SiGe, which in turn is provided on a silicon substrate. The thickness of the SiGe layer between the Si substrate underneath it and patch antenna 116, which is made of a conductive material, preferably a metal plating, is critical for the bandwidth of the emission frequency. For a patch antenna 116 thus integrated in an integrated circuit 100, bandwidths of approximately 2 GHz, 670 MHz, and 270 MHz result for an SiGe layer thickness of 127 Φm, 30 Φm, and 11 Φm. This yields an antenna gain of 7 dBi to 8 dBi.

In order not to be dependent on a modulation bandwidth of only approximately 170 MHz, an adapter device 15 for impedance adaptation is provided in integrated circuit 100, as shown in FIG. 1. Using such an antenna tuner, which is also integrated on the SiGe, bandwidths of more than 1 GHz, in particular more than 4 GHz, are possible. Integrating the antenna tuner as adapter device 15 renders possible a high-resolution short-range radar (SRR) using ultra-broadband technology. At an operating frequency of 77 GHz, for example, a patch antenna 116 having a surface area of approximately 1 mm×1.4 mm is required. In order to prevent coupling or interference on the chip, a free surface area of 2 mm×2 mm is preferably provided on the chip around patch antenna 116. If a 140 GHz HF signal is set as the operating frequency, only one free 1 mm×1 mm surface area is to be provided. If another patch made of a conductive material (not shown in FIG. 2) is installed on integrated circuit 100 upstream from patch antenna 116 at a predefined distance, the antenna gain increases to approximately 10 dBi, while the bandwidth also increases.

Figure 3:
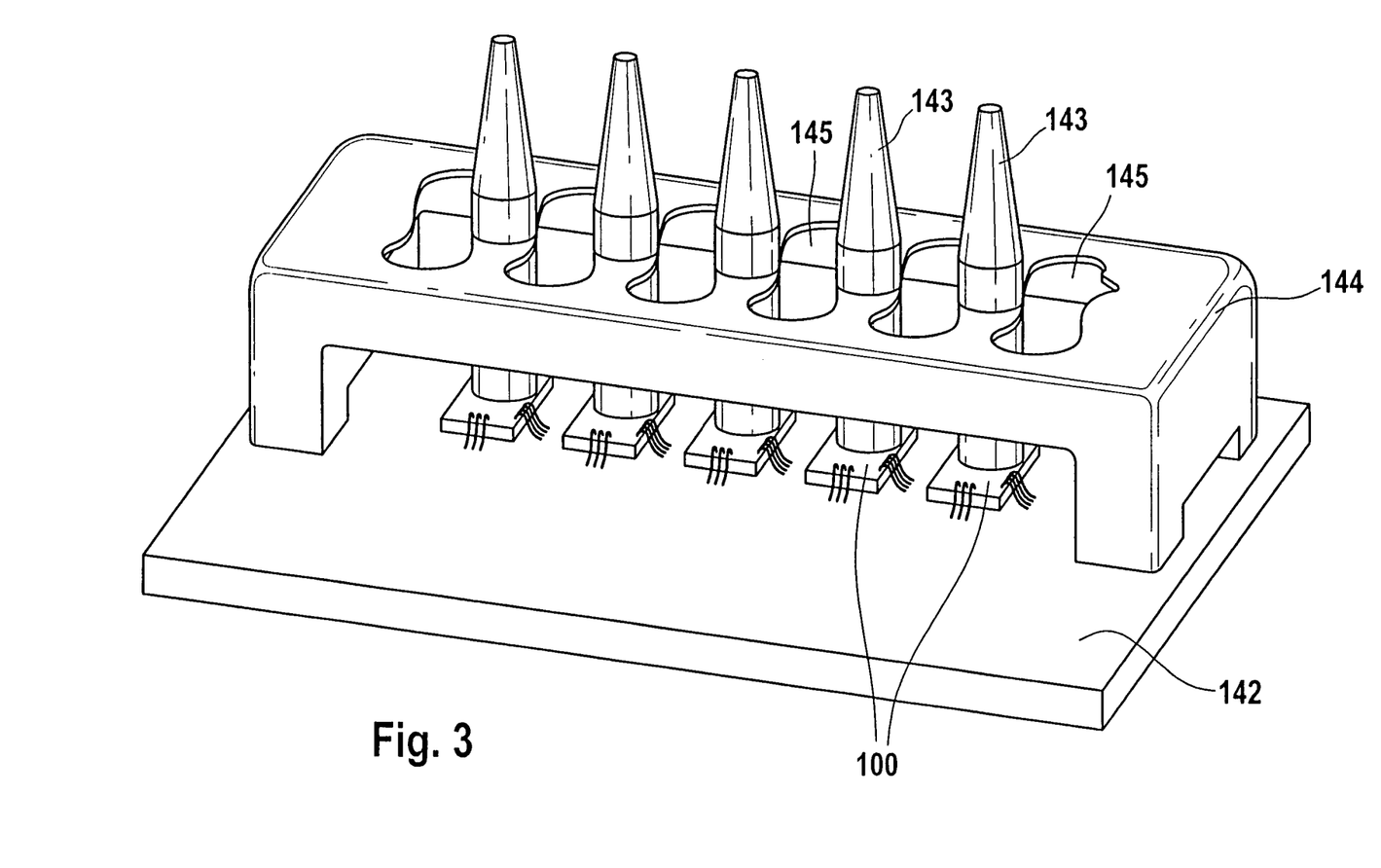
FIG. 3 shows a schematic oblique view of a radar surroundings detection device to elucidate a preferred refinement of the present invention.

FIG. 3 shows a preferred refinement of the present invention having a plurality of integrated circuits 100 arranged side by side in a row. Integrated circuits 100 are mounted, preferably glued, on a substrate 142. A polyrod made of a dielectric is provided as an emission device 143 over each integrated circuit in the area of the patch antenna. The bottom section of each individual emission device 143 (polyrod) has a cylindrical shape directly over the patch antenna, and its top section narrows to a truncated cone shape. Emission devices 143 over integrated circuits 100 are provided for improved, directional emission of HF waves, which are emitted by the patch antenna (in FIG. 3 covered by emission device 143).

According to FIG. 3, an emission device 143 is provided over each of the preferably five integrated circuits arranged side by side, emission devices 143 being laterally supported by a supporting device 144, similar to a bridge column construction. Supporting device 144 is preferably also made of a dielectric material and is glued or clipped onto substrate 142. Supporting devices 144 and emission devices 143 preferably form a single constructive unit and are manufacturable as an injection molded part. To improve the emission characteristics, kidney-shaped recesses 145 are provided in particular in supporting device 144 between individual emission devices 143. To protect integrated circuits 100, a casting compound (not shown in FIG. 3) which has a predefined, adjusted dielectric constant and thus also assumes an electrical function is preferably provided over individual integrated circuits 100.

Figure 4:
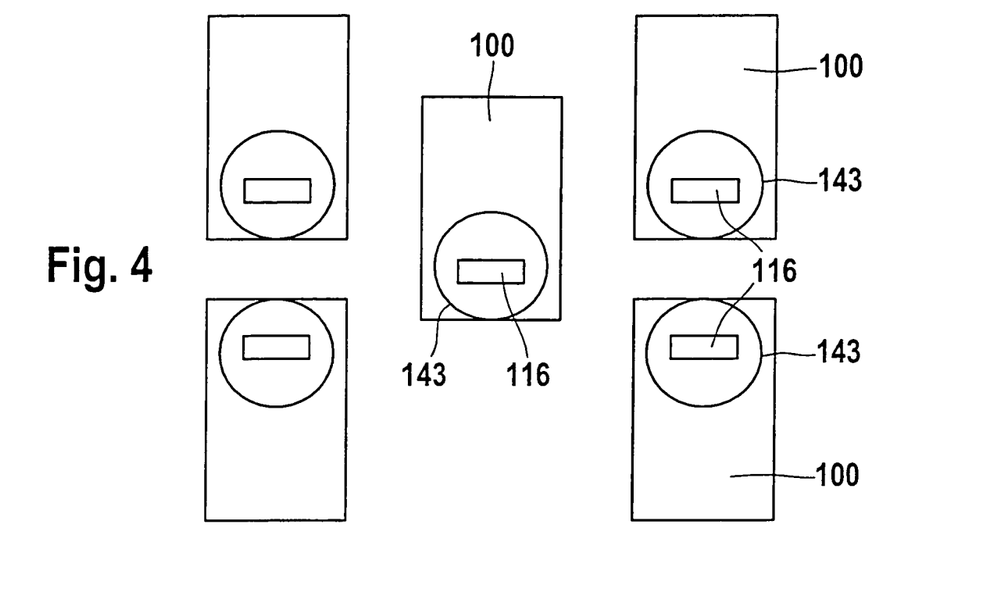
FIG. 4 shows a schematic top view of a system of integrated circuits to elucidate a preferred refinement of the present invention.
Figure 5:
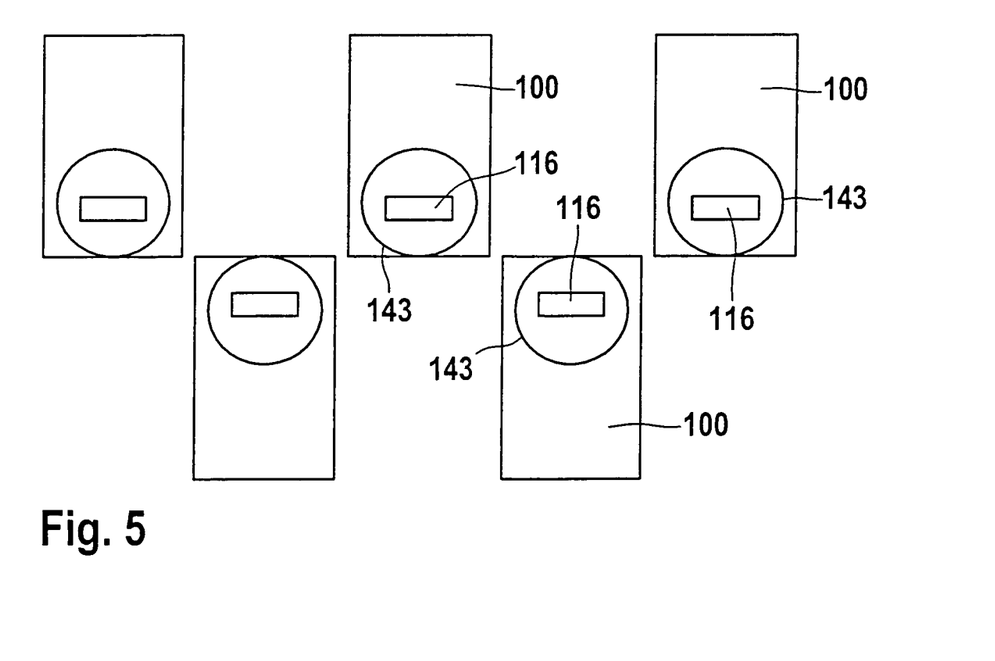
FIG. 5 shows a schematic top view of a system of integrated circuits to elucidate a refinement of the present invention.

FIGS. 4 and 5 provide a top view of further arrangement options of integrated circuits 100 in a plane. Patch antennas 116 are shown at an angle of 0° between the broad side of the patches and a long side of integrated circuit 100. Also in this case, any angle is conceivable. In addition, individual integrated circuits 100 are also shiftable in parallel in their entirety at any desired angle to their currently shown alignment, or also each individual integrated circuit 100 may be shifted by an individual predefined angle of alignment to optimize the emission characteristics. Although five integrated circuits 100 having emission devices 143 over each are shown in FIGS. 3, 4 and 5, any desired number of similar arrangements, in particular four or six, having any desired alignment with respect to one another are conceivable. In FIG. 4, two integrated circuits 100 are connected in antiparallel to one another, the fifth integrated circuit and its patch antenna 116 being located in the middle on the line of intersection of the imaginary lines connecting the upper left to lower right and upper right to lower left patch antennas 116. FIG. 5 shows an antiparallel arrangement in a two-row chessboard arrangement of the integrated circuits.

Figure 6:
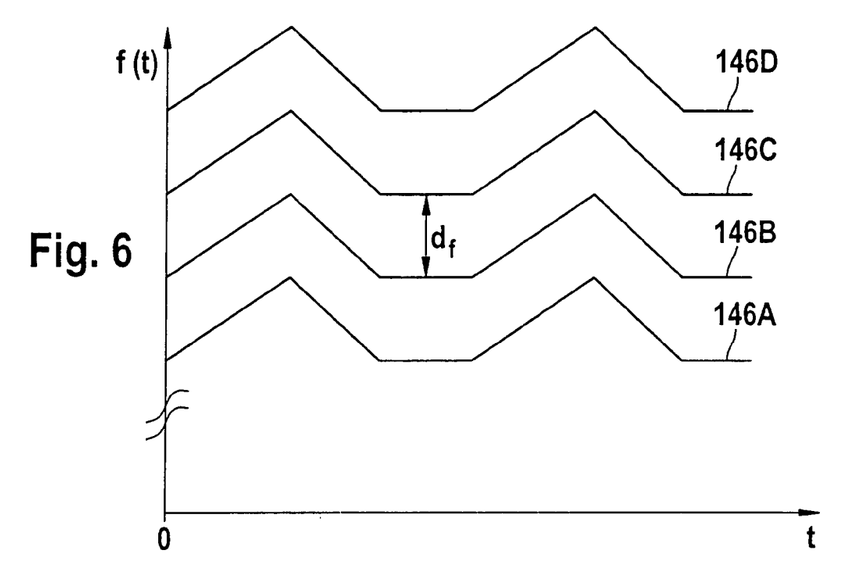
FIG. 6 shows a schematic frequency diagram over time to elucidate the functioning of an embodiment of the present invention.

Due to the narrow-band emission characteristics of patch antennas 116 and to further improve the isolation between the individual integrated circuits 100 according to FIGS. 3, 4, and 5, each integrated circuit 100 is assigned its own frequency synchronized with the frequencies of the other integrated circuits 100. FIG. 6 shows an example of the modulation curve of frequencies f(t) over time t. Other modulation methods are also possible. This results in a synchronized frequency response and the triangle-shaped modulation having an unmodulated section between successive triangular modulations. Frequency modulations 146A, 146B, 146C, and 146D, running parallel (synchronized) to one another have a predefined frequency spacing df. Frequency spacing df between the HF signals of integrated circuits 100 may be selected in such a way that no overlapping occurs between the emission HF signal and the reception HF signal of different integrated circuits during detection of the distance of an object. However, such overlapping of the frequency ranges is also possible. For cross-echo analysis, the differential frequency between two adjacent integrated circuits 100 and their frequency responses, for example, 146B, 146C, are determined and analyzed. FIG. 6 shows an FMCW system, all modulation forms, such as pulse modulation, pn chirp, FM chirp, mFSK modulation, etc. being possible.

Figure 7:
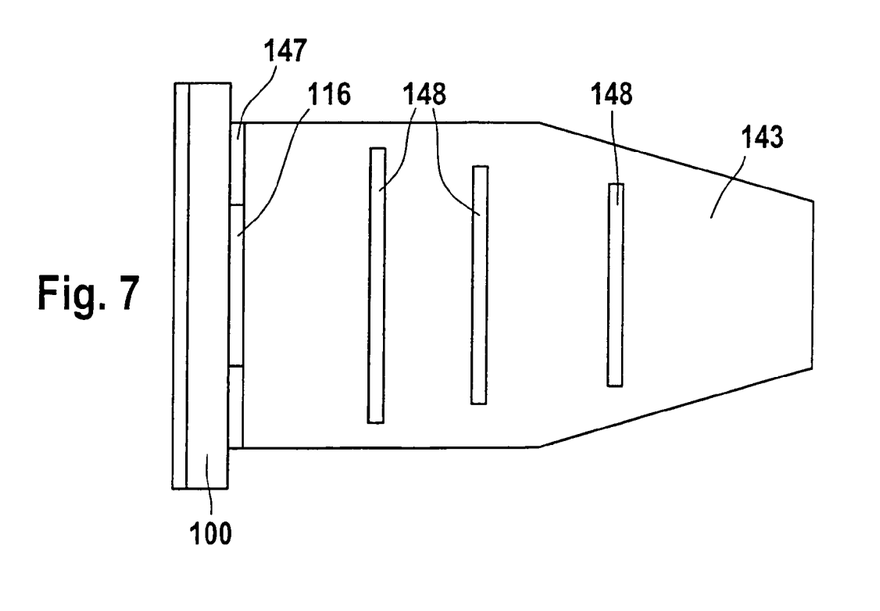
FIG. 7 shows a schematic cross-sectional view of an integrated circuit having an emission device to elucidate a preferred embodiment of the present invention.

FIG. 7 shows a cross section of an integrated circuit 100, having a patch antenna 116, an emission device 143 (polyrod) being attached over patch antenna 116 via an adhesive compound 147. To increase the antenna gain in emission device 143, a plurality of conductive, preferably patch-shaped, elements 148 are provided in parallel to transceiver device 116 (patch antenna). This results in a dielectrically shortened Yagi antenna.

Since transceiver device (antenna) 16, 116 is also integrated on integrated circuit (chip) 100, the reference frequency of signal processing and control device 24 according to FIG. 1, i.e., of a digital computer, occurs as the maximum frequency which must be transmitted by the integrated circuit to a substrate 142 according to FIG. 3, for example, when the digital computer is to be integrated on the chip. Otherwise cycle frequencies (originating from quartz devices) and interfaces, for example, 100 KHz to 50 MHz, are the highest frequencies which must be transmitted by integrated circuit 100 to a substrate 142. Appropriate construction and connection technologies, such as gluing, bonding, soldering, providing an underfiller under the integrated circuit, a flip-chip structure, components in a housing, etc., are available for this purpose and provide sufficiently low parasitic capacitances and inductances for this frequency range.

Although the present invention has been described on the basis of preferred exemplary embodiments, it is not limited thereto, but may be modified in many ways. Thus, despite reference to a distance or velocity measurement of an object, the present invention may also be used in other mm wave sensors or mm wave communication systems with appropriate frequency scaling. Sensors for measuring velocity over the ground represent another application. In addition, application in a distance measurement device (separate from a vehicle) or in lift regulation is also possible. Furthermore, the above-described frequencies, dimensions, materials, types of modulation, and chip arrangements are to be considered as examples only.

What is claimed is:

1. An integrated circuit for measuring at least one of a distance and a velocity of an object, comprising:
   a high-frequency signal generating device for generating a first HF (high frequency) signal having a predefined frequency and a predefined modulation curve from at least one LF (low frequency) signal;
   a diplexer device at least configured to separate or to mix signals of different frequencies, wherein the diplexer device is coupled to the high-frequency signal generating device, and wherein the diplexer device is additionally configured to determine a frequency offset between the first HF signal and a reflected second HF signal;
   a transceiver device coupled to the diplexer device and configured for sending the first HF signal and receiving the reflected second HF signal, the reflected second HF signal being a function of the predefined modulation curve of the first HF signal and a distance to a reflecting object; and
   an adapter device coupled between the diplexer device and the transceiver device, the adapter device adapting an impedance of the transceiver device to the predefined frequency of the first HF signal;
   wherein the HF signals are RF (radio frequency) signals and the LF signal is a digital word.

2. The integrated circuit as recited in claim 1, further comprising at least one of:
   an interface device for injecting at least one digital signal;
   a digital signal processing device coupled to the high-frequency signal generating device, wherein:
      the digital signal processing device processes the at least one digital signal and controls the integrated circuit; and
      an A/D converter coupled to the diplexer device and the digital signal processing device, the A/D converter digitizing the frequency offset.

3. The integrated circuit as recited in claim 2, wherein:
   the interface device injects the at least one digital signal via a CAN (controller area network) bus, and
   the digital signal processing device is coupled to the interface device.

4. The integrated circuit as recited in claim 1, wherein:
   the high-frequency signal generating device includes a modulation device and an oscillator.

5. The integrated circuit as recited in claim 4, wherein:
   the modulation device is coupled directly to the diplexer device, and
   the oscillator includes a VCO.

6. The integrated circuit as recited in claim 1, wherein:
   the integrated circuit at least one of uses BiCMOS technology and has one of SiGe, SiGeC, and SiC as a semiconductor substrate.

7. The integrated circuit as recited in claim 1, wherein:
   the transceiver device includes a patch antenna with a predefined alignment.

8. The integrated circuit as recited in claim 7, wherein:
   the predefined alignment is at an angle of 0° or 45° of a broad side of the patch antenna to a long side of the integrated circuit, and
   a frequency range of the first HF signal for the patch antenna is between 30 GHz and 300 GHz.

9. The integrated circuit as recited in claim 1, wherein:
   the adapter device is integrated on the integrated circuit and has an adjustable impedance.

10. A radar surroundings detection device, comprising:
    a plurality of integrated circuits, each integrated circuit including:
       a high-frequency signal generating device for generating a first HF (high frequency) signal having a predefined frequency and a predefined modulation curve from at least one LF (low frequency) signal,
       a diplexer device at least configured to separate or to mix signals of different frequencies, wherein the diplexer device is coupled to the high-frequency signal generating device, and wherein the diplexer device is additionally configured to determine a frequency offset between the first HF signal and a reflected second HF signal,
       a transceiver device coupled to the diplexer device and configured for sending the first HF signal and receiving the reflected second HF signal, the reflected second HF signal being a function of the predefined modulation curve of the first HF signal and a distance to a reflecting object, and
       an adapter device coupled between the diplexer device and the transceiver device, the adapter device adapting an impedance of the transceiver device to the predefined frequency of the first HF signal; and
    an emission device provided over each integrated circuit;
    wherein the HF signals are RF (radio frequency) signals and the LF signal is a digital word.

11. The radar surroundings detection device as recited in claim 10, wherein
    each emission device includes a truncated cone-shaped dielectric having at least one patch-shaped, conductive layer in parallel to the respective transceiver device.

12. The radar surroundings detection device as recited in claim 10, further comprising:
    a shared substrate via which the emission devices are interconnected via a shared substrate; and
    a casting compound having a predefined dielectric constant and being provided over the integrated circuits.

13. The radar surroundings detection device as recited in claim 10, wherein:
    at least one of four, five, and six integrated circuits are provided at least one of:

in parallel next to one another in a row with a predefined alignment, at an angle of 0° or 45° between a long side of the integrated circuit and a long side of a substrate, in a double triplet arrangement in one of parallel and antiparallel to one another, and in an antiparallel arrangement featuring the integrated circuits as offset with respect to one another.

14. The radar surroundings detection device as recited in claim 10, wherein:

at least two integrated circuits having a predefined frequency spacing with respect to one another and a predefined modulation curve synchronized to one another are operated.

15. The radar surroundings detection device as recited in claim 10, further comprising:

an amplifier device for amplifying the frequency offset and being connected downstream from the diplexer device.

16. The radar surroundings detection device as recited in claim 15, further comprising:

a second frequency generating device for generating a third HF signal, the diplexer device being coupled to the third HF signal, the second frequency generating device determining a cross-correlation between the frequency offset and the third HF signal.

* * * * *